United States Patent [19]

Swanson

[11] Patent Number: 4,468,626
[45] Date of Patent: Aug. 28, 1984

[54] POLYPHASE PDM AMPLIFIER

[75] Inventor: Hilmer I. Swanson, Quincy, Ill.

[73] Assignee: Harris Corporation, Melbourne, Fla.

[21] Appl. No.: 342,374

[22] Filed: Jan. 25, 1982

[51] Int. Cl.³ .............................................. H03F 3/38
[52] U.S. Cl. ..................................... 330/10; 330/149; 330/251; 330/295
[58] Field of Search ................ 330/10, 149, 251, 295, 330/207 A, 124 R; 332/31 R

[56] References Cited

U.S. PATENT DOCUMENTS

| | | | |
|---|---|---|---|
| 3,022,465 | 2/1962 | Slenker et al. | 330/30 |
| 3,153,203 | 10/1964 | Sem-Jacobsen et al. | 330/30 |
| 3,290,617 | 12/1966 | Bellum | 332/14 |
| 3,328,710 | 6/1967 | Baldwin | 329/103 |
| 3,386,041 | 5/1968 | Bell | 329/102 |
| 3,500,066 | 3/1970 | Pritchett | 307/235 |
| 3,585,517 | 6/1971 | Herbert | 330/297 |
| 4,164,714 | 8/1979 | Swanson | 330/10 |

OTHER PUBLICATIONS

Hager, Wolfgang and Rudolph, Klaus, "A Simple Trasistorized RF PWR AMP-etc.", Nuclear Inst. and Methods, Sep. 15, 1975, p. 167.

Primary Examiner—James B. Mullins
Assistant Examiner—Steven J. Mottola
Attorney, Agent, or Firm—Yount & Tarolli

[57] ABSTRACT

A polyphase PDM amplifier is disclosed including plural parallel PDM amplifier stages (10, 12, 14, 16), all amplifying the same input signal. The PDM amplifier outputs are combined to produce a combined amplifier output. The various PDM amplifier stages modulate PDM carrier signals of like frequencies but differing phases. Capacitors (40, 42, 44, 46) are connected from each amplifier output to a common circuit node (48). These capacitors reduce the amplitudes of the spurious, out-of-phase components in the amplifier outputs which are introduced by the PDM modulation-demodulation process.

20 Claims, 3 Drawing Figures

POLYPHASE PDM AMPLIFIER

BACKGROUND AND FIELD OF THE INVENTION

The present invention relates to amplifiers, and more particularly to an improved polyphase pulse duration modulation (PDM) amplifier.

Pulse duration modulation is sometimes used in power amplifiers to achieve efficiency of operation. In these amplifiers an input signal is used to pulse duration modulate a carrier signal, and the resulting PDM signal is amplified. The amplified PDM signal is then filtered to recover a demodulated signal corresponding to an amplified input signal. The patent to Swanson, U.S. Pat. No. 4,164,714, discloses a polyphase PDM amplifier wherein the amplified signal is formed by combining the outputs of plural parallel-connected PDM amplifiers. All of the amplifiers respond to a common input signal, but have differently phased PDM carrier signals. Polyphase PDM amplifiers of this type enjoy various advantages over earlier, single phase PDM amplifiers. The amplifier elements used in polyphase PDM amplifiers operate at relatively low switching frequencies and power levels, permitting semiconductor devices to be used as the active amplifier elements instead of vacuum tube devices.

The filters used in PDM amplifiers to demodulate the PDM signal should remove substantially all of the frequency component artifacts of the PDM amplification process. This can present a formidable problem, however, where the frequency of the spurious component is near the frequency range of the amplified signal. Very selective filters can provide the desired performance, but may be rather complex and expensive. Less expensive filters may not provide the desired degree of attenuation of the spurious components.

SUMMARY OF THE INVENTION

It has now been found that the performance of the polyphase PDM amplifier described in U.S. Pat. No. 4,164,714 can be improved by connecting frequency selective means, e.g., capacitors, between the outputs of the plural parallel PDM amplifiers so as to provide a low impedance circuit path between their outputs at frequencies above a first frequency. When thus modified, improved attenuation of the spurious components introduced by the PDM amplification process results.

It is an object of the present invention to provide an improved polyphase PDM amplifier.

It is another object of the present invention to provide a polyphase PDM amplifier characterized by improved noise performance.

It is a more general object of the present invention to provide a method of improving the noise performance of amplifiers wherein plural parallel-connected amplifier stages are used.

In accordance with one aspect of the present invention an improved polyphase PDM amplifier system is provided comprising plural PDM amplifiers all operating with a common input signal but differently phased PDM carrier signals, frequency selective circuit means for providing a low impedance circuit path between the output of the plural PDM amplifiers at frequencies above a first frequency, and means for combining the outputs of the plural amplifiers at other frequencies.

BRIEF DESCRIPTION OF THE DRAWINGS

The foregoing and other objects and advantages of the present invention will become more readily apparent from the following detailed description, as taken in conjunction with the accompanying drawings, wherein.

DETAILED DESCRIPTION

Figure 1:
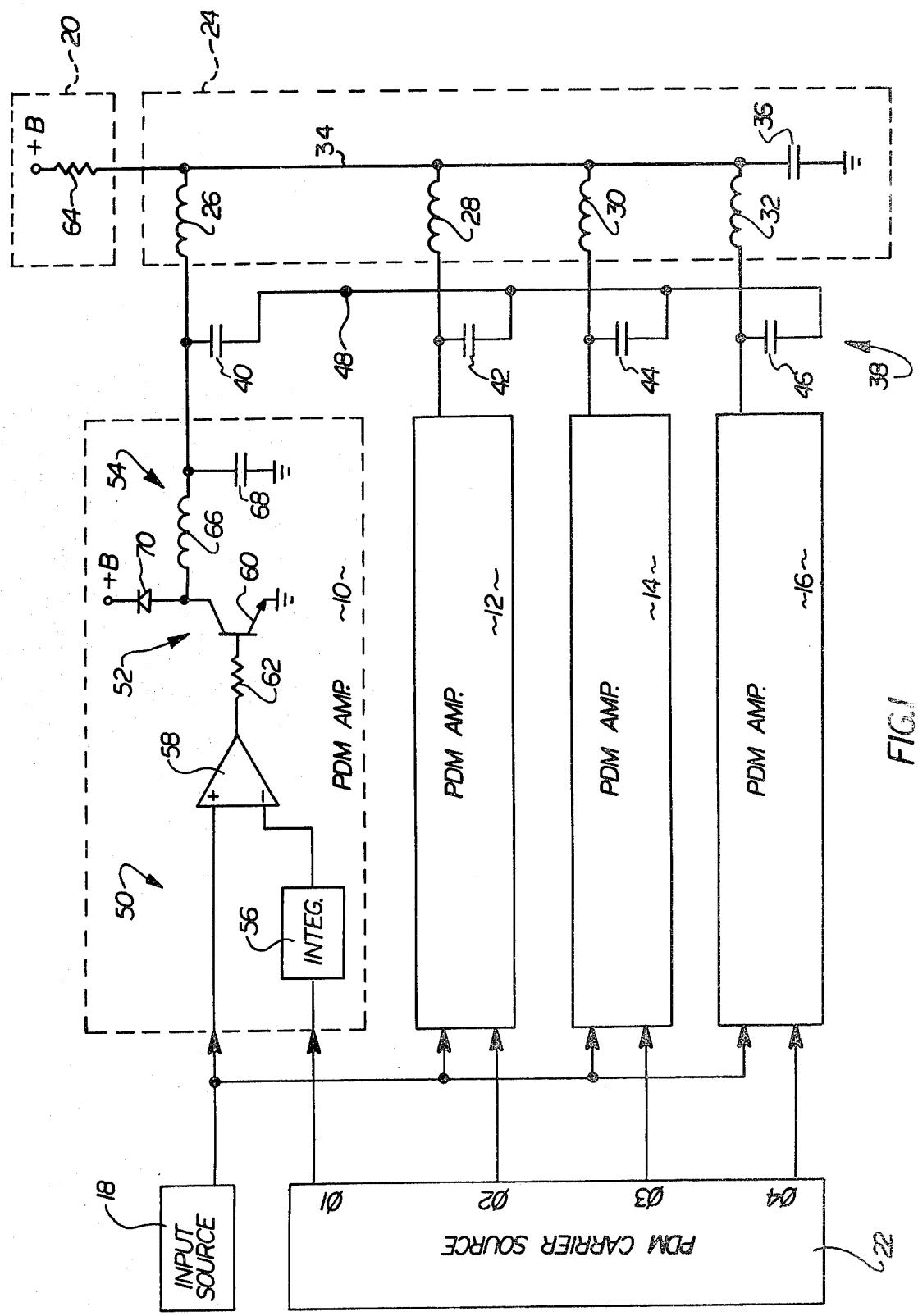
FIG. 1 is a block diagram of an improved polyphase PDM amplifier in accordance with the teachings of the present invention.

FIG. 1 illustrates a polyphase PDM amplifier incorporating the present invention. The polyphase PDM amplifier includes a plural PDM amplifier stages 10, 12, 14 and 16 connected in parallel between a common input source 18 and a common output device 20. Each amplifier stage receives a modulating input signal and a PDM carrier signal. The four modulators 10, 12, 14 and 16 receive the same modulating input signal provided by an input source 18, but receive different carrier signals. The carrier signals provided to the four PDM amplifier stages 10, 12, 14 and 16 are all generated by a PDM carrier source 22 which generates four square-wave signals of common frequency but different phase. These four carrier frequencies are preferably equally displaced in phase. More particularly, the four carrier signals are displaced in phase by 90° with respect to one another whereby the four carrier signals have relative phases of 0°, 90°, 180°, and 270°.

The PDM amplifier stages are all identical to stage 10, which is shown in detail in FIG. 1 and will be described hereinafter. Generally, each stage pulse duration modulates its respective PDM carrier signal provided by PDM carrier source 22, amplifies the resulting PDM signal, and thereafter filters the amplfied PDM signal to recover an amplified input signal. The amplified signal is, in each case, applied to the amplifier output line.

The four amplified signals provided by the four PDM amplifier stages are combined in a combiner circuit 24 to form a combined amplified signal for application to the output device 20. The combiner circuit may, of course, take many forms, but is shown in FIG. 1 as including inductors 26, 28, 30 and 32, each connected between the output of a corresponding PDM amplifier stage and a common node 34, which represents the output of the combiner. A capacitor 36 is connected between the common node 34 and ground. The inductors and capacitor not only add the four amplifier output signals together, but also provide an additional stage of filtering. Each of the inductors 26–32 represents the "series" element of a half section low-pass filter, where the capacitor 36 represents the single, common "shunt" element for all of the filters.

The combined amplified signal appears on the common node 34, which represents the output of the polyphase PDM amplifier. Any suitable utilization device 20 may be connected to the output of the polyphase PDM amplifier for using the amplified signal which it provides.

It has been found that one mechanism of noise generation in a polyphase PDM amplifier of this type is the nonmatching of the residual PDM carrier frequency components in the outputs of the individual PDM amplifier stages 10-16. The output signal provided by each amplifier stage represents an amplified version of the input signal, but also includes a small superimposed "ripple" component at the frequency and phase of the PDM carrier signal. The ripple component is caused by incomplete removal of the PDM carrier component by the PDM demodulating filter in the amplifier. Since the PDM carrier signals provided to the amplifiers 10 and 14 are 180° out of phase (i.e., in phase opposition), their ripple components are similarly in phase opposition. In theory, then, they should cancel one another when combined in the combiner 24. This is also true of the ripple in the outputs of amplifiers 12 and 16. In practice this does not seem to occur. It appears that the PDM amplifier output signals experience unequal phase delays in the combiner 24 and are therefore no longer in phase opposition when combined.

In accordance with the present invention the PDM ripple components are reduced by connecting a frequency selective circuit 38 between the outputs of the various individual PDM amplifier stages 10-16 for shorting their outputs together at frequencies above a selected frequency limit. In FIG. 1 the frequency selective circuit takes the form of plural capacitors 40, 42, 44 and 46, each connected between the output of a corresponding one of the amplifiers 10, 12, 14 and 16 and a common node 48. (When only two PDM amplifiers are used, the frequency selective circuit will preferably comprise a single capacitor connected between their outputs.)

When the polyphase PDM amplifier is being used to amplify audio signals, the capacitors 40, 42, 44 and 46 are selected to have values such that their impedances roll off at approximately 20 kHz, which is commonly accepted as being the upper limit of the audio frequency band. The capacitors provide a high impedance circuit path between the amplifier outputs at DC and low frequencies, and a much lower impedance circuit path for frequencies above the roll-off frequency.

The capacitors 40, 42, 44 and 46 do not influence the common portion of the output signals. This is because no current flows through a capacitor when the same voltage signal is applied to both sides of it. The capacitors do, however, attenuate the differential portion of the output signals, such as the out-of-phase ripple components and noise appearing in one output signal but not another (or which appears in different output signals at different times). The capacitors are quite effective at reducing this differential portion, lowering it by 10-20 db.

The differential portion induces a current through the capacitors from one amplifier output to another. The current flow causes voltage drops at each amplifier output since the amplifier outputs exhibit a finite, non-zero output impedance. These voltage drops follow the differential portion of the amplifier output signals, and thereby cancel the differential portion to a substantial extent.

FIG. 1 also shows one exemplary form which the amplifier 10 may take. The amplifier 10 is shown as including a PDM modulator 50, a pulse amplifier 52, and a PDM demodulator filter 54. The PDM modulator includes an integrator 56 and a comparator 58. The integrator 56 integrates the squarewave carrier signal provided by carrier source 22 to provide a triangular wave signal of similar frequency and phase on its output. The comparator 58 has its noninverting (+) input line connected to input source 18 and its inverting (−) input line connected to the output of the integrator 56. When connected thus, the output of comparator 58 will be at a high voltage level (e.g., +B) when the input signal is greater than the instantaneous level of the triangular wave, and a low voltage level (e.g., ground potential) when the input signal is below the instantaneous level of the triangular wave. As long as the input signal level is below the peak level of the triangular wave, the output of the comparator is a pulse duration modulated signal.

The pulse duration modulated signal is a bilevel signal comprised of periodic pulses of fixed frequency (the frequency of the triangular wave) and variable duration. The duration of the pulses is related to the level of the input signal. In the example being described the pulse duration is directly proportional to input signal level.

The PDM signal is amplified by a pulse amplifier 52, which in FIG. 1 is shown as a conventional single transistor, common-emitter, class "D" amplifier. The amplifier includes a single NPN bipolar junction transistor 60 whose base electrode is connected to the output of comparator 58 through a current limiting resistor 62. The emitter of transistor 60 is grounded while its collector is connected to the amplifier output through filter 54. The amplifier output is in turn connected to a DC supply voltage (+B) through load 20, which is characterized as a resistor 64 in FIG. 1.

The transistor's collector-emitter current path is therefore connected in series with filter 54 and load 20 across a +B supply. The conductive state of transistor 60 switches in unison with the PDM signal, thereby applying an amplified PDM signal across filter 54 and load 20.

The low-pass filter 54 filters the amplified PDM signal to recover an amplified input signal. The filter includes an inductor 66 and capacitor 68, where the inductor is connected between the amplifier output and the collector of transistor 60, and the capacitor is connected between the amplifier output and ground. The values of inductor 66 and capacitor 68 are selected so that the filter has a cutoff frequency above the highest frequency of the input signal and below the frequency of the PDM carrier signals provided by PDM carrier signal source 22. A free wheeling diode 70 is connected between the collector of transistor 60 and the +B supply line to clip the inductive spikes which appear at the collector of transistor 60 each time it switches from a conductive to a nonconductive state.

Figure 2:
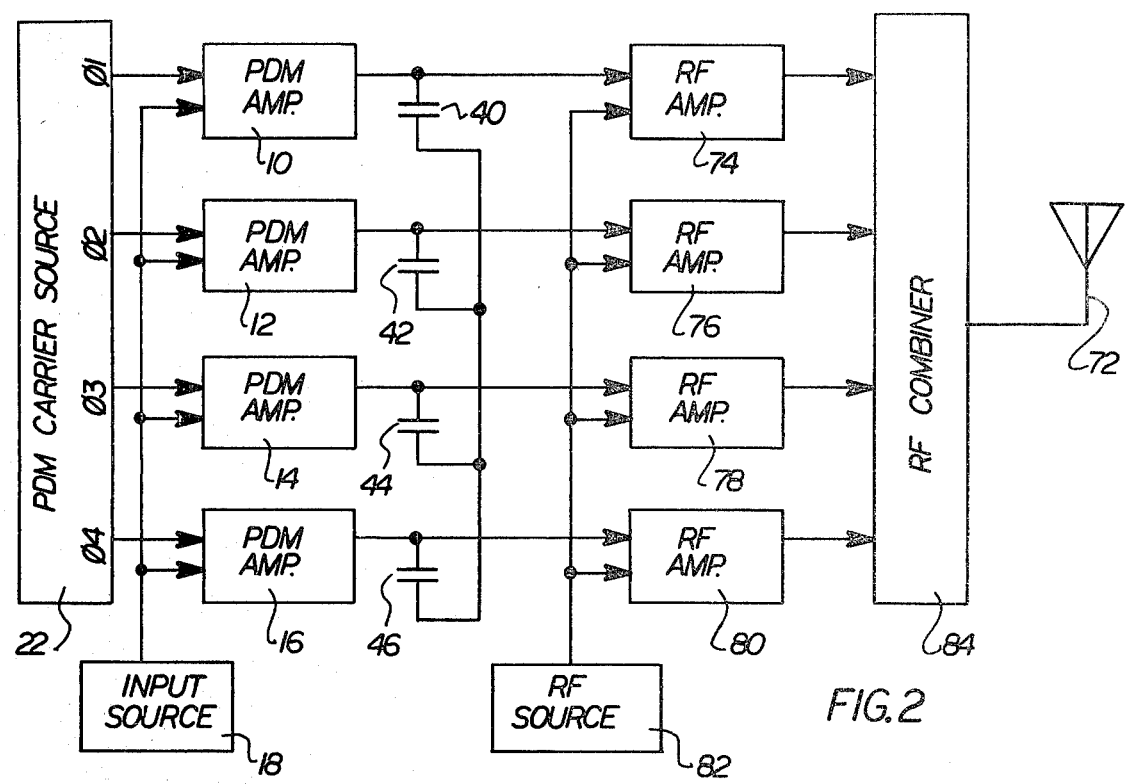
FIG. 2 is a more detailed circuit schematic of an embodiment of the present invention wherein the plural PDM output signals each amplitude modulates a corresponding RF carrier signal.

FIG. 2 shows the use of the invention in an RF amplitude modulator embodiment. In this Figure the output device 20 is shown as comprising a broadcast antenna 72. As in the FIG. 1 embodiment, a PDM carrier source 22 is included which generates four common frequency, differently phased squarewave signals for application to corresponding PDM amplifiers 10, 12, 14 and 16. Also as in FIG. 1, the outputs of the various PDM amplifiers are connected to a common node 48 through associated capacitors 40-46 to reduce PDM ripple and other spurious components.

In FIG. 2, however, the combiner has a quite different form than in FIG. 1. In FIG. 2 the amplifier output signals are combined by first using each to amplitude modulate a corresponding RF carrier signal, with the resulting amplitude modulated carrier signals being combined to form a combined amplitude modulated carrier signal.

To this end, the output of each PDM amplifier is connected to an input of a corresponding one of four RF amplifiers 74, 76, 78 and 80. Each RF amplifier amplifies the RF carrier signal provided by RF carrier source 82. Each PDM amplifier output signal modulates the power supply of its associated RF amplifier, thereby amplitude modulating the RF carrier signal being provided at the RF amplifier output. An RF combiner 84 receives all of the amplitude modulated RF carrier signals, combines them, and provides the resulting combined signal to the broadcast antenna 72.

Figure 3:
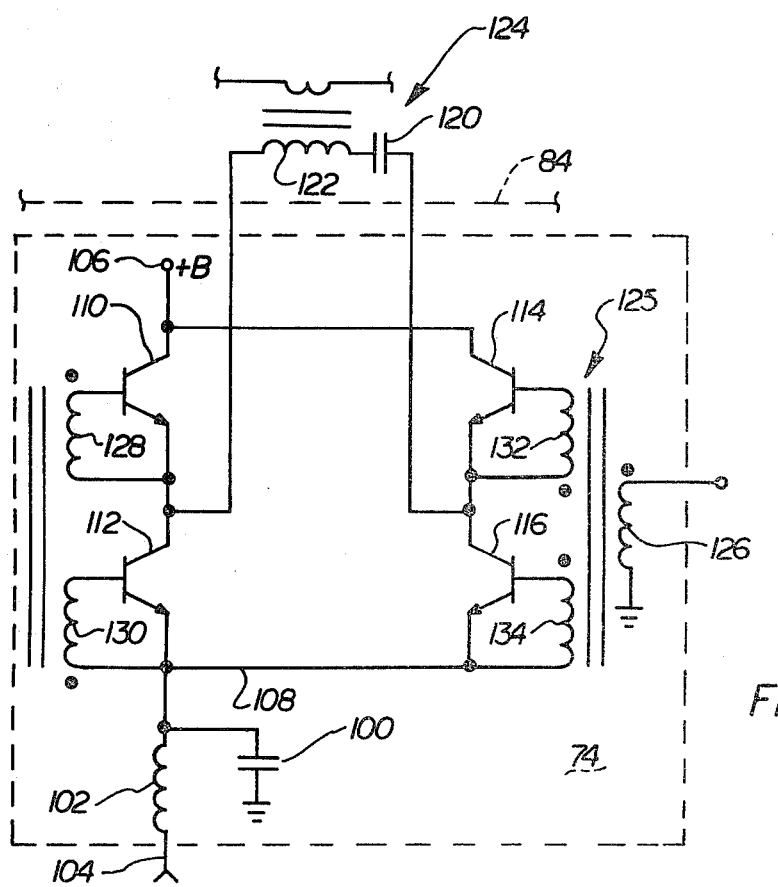
FIG. 3 is a circuit schematic illustrating the contents of one of the RF power amplifier blocks of the FIG. 2 embodiment.

FIG. 3 illustrates one form which the RF amplifier 74 of FIG. 2 may take, it being understood that power amplifiers 76, 78 and 80 may have a similar form. In FIG. 3 the power amplifier 74 is shown as including four BJT transistors 110, 112, 114 and 116 connected in a bridge arrangement between the +B supply voltage 106 and a modulation control line 108. The modulation line 108 is connected to the audio input line 104 through another low-pass filter including a series inductor 102 and a shunt capacitor 100.

More particularly, the collector/emitter current paths of transistors 110 and 112 are connected in series between the +B supply rail 106 and the modulation control line 108. The collector/emitter current paths of transistors 114 and 116 are similarly connected in series between the +B supply rail 106 and the line 108. The output of the RF power amplifier is taken across the bridge junctions, which are the junctions between transistor 110 and 112 on the one hand and transistors 114 and 116 on the other hand. In FIG. 3 the load circuit connected across these two junctions is shown as comprising a series combination of a DC blocking capacitor 120 and the primary winding 122 of a transformer 124. The capacitor 120 and transformer 124 form part of the combiner circuit 84, and will be further described hereinafter.

In operation, RF signals are applied to the bases of the four transistors 110-116 such that the load circuit (i.e., capacitor 120 and primary winding 122) is connected between supply rail 106 and control line 108 first in one direction and then in the other direction, with these connections alternating at the RF frequency. The result is that an RF signal is supplied across the transformer winding 122. This RF signal has a frequency corresponding to the frequency at which the transistors are switching, and a magnitude corresponding to the difference between the voltage supplied to the supply rail 106 and the voltage on the control line 108. The +B supply voltage on supply rail 106 is a fixed DC voltage, however, whereby the level of the RF signal applied across transformer winding 122 is directly dependent upon the signal applied to the audio input line 108.

The switching of the bridge transistors is controlled by an RF input transformer 125 having a primary winding 126 and plural secondary windings 128, 130, 132 and 134. Each of the four secondary windings is connected across the base-emitter junction of a corresponding transistor, and controls the switching of that transistor.

The primary winding 126 of the input transformer 125 is connected across the output of the RF source 82, whereby the RF signal appears across the base-emitter junctions of each of the transistors 110-116. The various secondary windings 128-134 are connected to the corresponding transistors 110-116 in such a polarity that the applied RF signal appears across the base-emitter junctions of transistors 110 and 116 in-phase with the applied RF input signal, and across the base emitter junctions of transistors 112 and 114, 180° out of phase with the applied RF input signal. Because of this, transistors 110 and 116 will be "on" and transistors 112 and 114 will be "off" when the applied RF signal is on its positive half cycle. The secondary winding 122 of the transformer 124 will thus be connected across the lines 106 and 108 in a first direction. When the applied RF signal is on its negative half cycle, however, transistors 110 and 116 will be "off" and transistors 112 and 114 will be "on", whereby the primary winding 122 of transformer 124 will be connected across the line 106 and 108 in the opposite direction. The primary winding 122 of transformer 124 is therefore connected across the lines 118 and 108 alternatively in positive and negative directions at the RF rate.

The combiner 84 includes a DC blocking capacitor such as blocking capacitor 120 and a transformer such as transformer 124 for each RF amplifier output. Furthermore the transformer and capacitor associated with each RF amplifier are connected to the output of the associated RF amplifiers in the fashion shown in FIG. 3. The secondary windings 126 of each of these transformers are connected in series, whereby the voltages provided thereby add together to produce a combined signal. This combined signal is applied across the antenna 52.

Although the invention has been described with respect to a preferred embodiment, it will be appreciated that various rearrangements and alterations of parts may be made without departing from the spirit and scope of the present invention, as defined in the appended claims.

What is claimed is:

1. Apparatus comprising:
    plural pulse duration modulation amplifier means, all responsive to the same input signal for each providing an associated amplifier output signal on its respective amplifier output, each said amplifier output signal including a spurious component introduced by the pulse duration modulation amplification process, said spurious components of the plural said amplifier output signals being out of phase with one another;
    combiner means for combining the plural amplifier output signals provided by said plural pulse duration modulation amplifier means to provide a combined signal; and
    frequency selective circuit means connected between the amplifier outputs of said plural amplifier means, said circuit means exhibiting an impedance between said outputs that is low at frequencies above a first preselected frequency compared to the impedance at frequencies below said preselected frequency so as to thereby attenuate said spurious components in said combined signal.

2. Apparatus as set forth in claim 1, wherein said frequency selective circuit means comprises capacitive impedance means connected between said amplifier outputs.

3. Apparatus as set forth in claim 2 wherein there are two said amplifier means and wherein said capacitive impedance means comprises a capacitive impedance connected between the outputs of said two amplifier means.

4. Apparatus as set forth in claim 2 wherein said capacitive impedance means comprises plural capacitive impedances each connecting the output of a corresponding one of said amplifier means to a common node.

5. Apparatus as set forth in claim 1 wherein said plural pulse duration modulation amplifiers use carrier signals of like frequency but unlike phase.

6. Apparatus as set forth in claim 1 wherein carrier signal providing means are included for providing plural carrier signals of like frequency but unlike phase, and wherein each said pulse duration modulation amplifier is responsive to an associated one of said carrier signals for pulse duration modulating said carrier signal in accordance with said input signal.

7. Apparatus as set forth in claim 6 wherein each of said pulse duration modulation amplifiers further comprises filter means for filtering the associated said pulse duration modulated carrier signal to thereby recover said input signal therefrom, and means for applying the recovered said input signal to said amplifier output.

8. Apparatus comprising:
plural amplifier means, all responsive to the same input signal for each providing an associated amplifier output signal on its respective amplifier output;
combiner means for combining the plural amplifier output signals provided by said plural amplifier means to provide a combined signal; and
frequency selective circuit means connected between the amplifier outputs of said plural amplifier means, said circuit means exhibiting an impedance between said outputs that is low at frequencies above a first preselected frequency compared to the impedance at frequencies below said preselected frequency so as to thereby attenuate spurious components in said combined signal,
wherein said combiner means comprises plural RF carrier modulator means each responsive to an associated one of same amplifier output signals for modulating an RF carrier signal therewith to provide a modulated carrier signal, and RF combining means for combining said modulated carrier signal.

9. Apparatus as set forth in claim 8 wherein each said RF carrier modulator means comprises amplitude modulator means for amplitude modulating said RF carrier signal in accordance with said associated one of said amplifier output signals, and further wherein said RF combining means comprises means for adding together the plural modulated RF carrier signals provided by said plural RF carrier modulator means so as to thereby provide a combined modulated carrier signal.

10. Apparatus as set forth in claim 8 wherein each of said plural amplifier means comprises a pulse duration modulation amplifier.

11. Apparatus as set forth in claim 10 wherein PDM carrier signal providing means are included for providing plural PDM carrier signals of like frequency but unlike phase, and wherein each said pulse duration modulation amplifier includes means responsive to an associated one of said PDM carrier signals for pulse duration modulation said PDM carrier signal in accordance with said input signal, and filter means for filtering the resulting pulse duration modulated carrier signal so as to thereby provide a demodulated signal on the associated amplifier output as said amplifier output signal.

12. Apparatus as set forth in claim 11, wherein said frequency selective circuit means comprises plural capacitive impedances, each connected between the output of a corresponding one of said amplifier means and a common circuit node.

13. Apparatus comprising:
plural PDM amplifier means, all responsive to the same input signal for each providing an associated amplifier output signal on its respective amplifier output, each said amplifier output signal including a spurious component introduced by the PDM amplification process, said spurious components of the plural said amplifier output signals being out of phase with one another; and
plural capacitive impedance means, each connected between the output of a corresponding one of said PDM amplifier means and a common circuit node, for providing filtering of said out-of-phase spurious components.

14. Apparatus as set forth in claim 13 further comprising PDM carrier signal providing means for providing plural PDM carrier signals of like frequency but unlike phase, and wherein each said PDM amplifier means includes means responsive to an associated one of said PDM carrier signals for pulse duration modulating said PDM carrier signal in accordance with said input signal, and filter means for filtering the resulting pulse duration modulated carrier signal so as to thereby provide a demodulated signal on the associated amplifier output, said demodulated signal including a spurious component at the phase and frequency of said pulse duration modulated carrier signal.

15. Apparatus as set forth in claim 13 and further comprising means for combining said plural amplifier output signals to thereby provide a combined signal.

16. Apparatus as set forth in claim 15 wherein said combining means comprises plural RF modulator means each responsive to an associated one of said amplifier output signals for modulating an associated RF carrier signal in accordance therewith, and RF signal combining means for combining the plural modulated RF carrier signals provided by said plural RF modulator means.

17. Apparatus as set forth in claim 16 wherein each said RF modulator means is an RF amplitude modulator for amplitude modulating said associated RF carrier signal in accordance with said associated amplifier output signal.

18. Apparatus comprising:
two PDM amplifier means, both responsive to the same input signal for each providing an associated amplifier output signal on its respective amplifier output, said amplifier output signals including spurious components introduced by the PDM amplification process, said spurious components of the two amplifier output signals being out of phase with one another; and
a capacitive impedance connected between the two amplifier outputs for reducing the amplitude of said spurious components.

19. Apparatus comprising:
PDM carrier signal providing means for providing plural PDM carrier signals of like frequency but unlike phase;
plural PDM means all responsive to a common modulating input signal for each pulse duration modulating a corresponding one of said PDM carrier signals in accordance therewith;
plural filter means, each responsive to a corresponding one of said modulated PDM carrier signals for filtering said corresponding signal to thereby demodulate said modulated PDM carrier signal, and for providing the demodulated signal on a filter output line; and plural capacitive impedance means, each connected between a corresponding one of said filter output lines and a common circuit node.

20. Apparatus as set forth in claim 19 and further comprising means for combining said plural amplifier output signals to thereby provide a combined signal.

* * * * *